(12) United States Patent
Morikawa et al.

(10) Patent No.: US 7,494,286 B2
(45) Date of Patent: Feb. 24, 2009

(54) LASER MODULE AND METHOD FOR MANUFACTURING THE SAME

(75) Inventors: Akihiro Morikawa, Osaka (JP); Toshifumi Yokoyama, Katono (JP); Yasuo Kitaoka, Ibaraki (JP); Kazuhisa Yamamoto, Takatsuki (JP)

(73) Assignee: Panasonic Corporation, Osaka (JP)

( * ) Notice: Subject to any disclaimer, the term of this patent is extended or adjusted under 35 U.S.C. 154(b) by 105 days.

(21) Appl. No.: 10/534,438

(22) PCT Filed: Nov. 12, 2003

(86) PCT No.: PCT/JP03/14343

§ 371 (c)(1),
(2), (4) Date: May 10, 2005

(87) PCT Pub. No.: WO2004/049526

PCT Pub. Date: Jun. 10, 2004

(65) Prior Publication Data

US 2006/0034570 A1    Feb. 16, 2006

(30) Foreign Application Priority Data

Nov. 12, 2002    (JP)    ............................. 2002-328053

(51) Int. Cl.
*G02B 6/36* (2006.01)
*G02B 6/12* (2006.01)

(52) U.S. Cl. .......................................... 385/88; 385/14

(58) Field of Classification Search ................... 385/88, 385/14
See application file for complete search history.

(56) References Cited

U.S. PATENT DOCUMENTS 5,007,700 A * 4/1991 Albares ........................ 385/38

(Continued)

FOREIGN PATENT DOCUMENTS

EP    1 041 419 A1    10/2000

(Continued)

*Primary Examiner*—K. Cyrus Kianni
(74) *Attorney, Agent, or Firm*—Hamre, Schumann, Mueller & Larson, P.C.

(57) ABSTRACT

Efficient coupling structures are important for the realization of reliable and economical integrated optical circuit applications. This paper presents a new approach for the simulation of an anisotropic plasma etching process in silicon based on a string point model as well as the realization and the results of etching processes in silicon, silicon dioxide, silicon oxinitride and silicon nitride which are fundamental for the fabrication of coupling structures. The connections to active and passive components were fabricated using plasma etching and deposition processes which are compatible with C-MOS or BIC-MOS technology. The realized waveguide-detector structures with vertical and horizontal silicon PIN-diodes exhibit efficiencies close to 90% for wavelength below 1.1 micrometers. The diodes can detect signals of modulation frequencies of more than 400 MHz due to horizontal light injection and capacitances less than 1 pF. Fiber-detector coupling structures with U-grooves for the fiber alignment containing such detectors show similar results. The necessary accuracy of the etched depth of the U-grooves for fiber-detector coupling is +/−2 micrometers in contrast to a fiber-waveguide coupling which requires a reproducible accuracy of the process better than 0.5 micrometers. A reduction of coupling losses due to the necessary close tolerances is accomplished by waveguide tapers. The simulation, realization and results for such structures are presented in the paper. Also laser diode—fiber connections require extremely close tolerances. The design of a micro-optical bench realized by plasma etching and a self-aligning soldering process is presented, which allows such tolerances.

12 Claims, 13 Drawing Sheets

U.S. PATENT DOCUMENTS

| | | | |
|---|---|---|---|
| 6,141,471 A * | 10/2000 | Agatsuma | 385/49 |
| 6,261,858 B1 | 7/2001 | Kitaoka et al. | |
| 6,277,772 B1 * | 8/2001 | Gancet et al. | 442/327 |
| 6,371,664 B2 * | 4/2002 | Takahashi et al. | 385/88 |

FOREIGN PATENT DOCUMENTS

| | | | |
|---|---|---|---|
| JP | 56-154173 | | 4/1980 |
| JP | 63163805 | * | 12/1996 |
| JP | 2000098192 | * | 4/2000 |
| JP | 3156444 | | 2/2001 |
| JP | 2001-242349 | | 9/2001 |
| JP | 2001-242499 | | 9/2001 |

* cited by examiner

US 7,494,286 B2

LASER MODULE AND METHOD FOR MANUFACTURING THE SAME

TECHNICAL FIELD

The present invention relates to a laser module with a semiconductor laser and an optical waveguide device mounted on a sub-mount and a method for manufacturing the same.

BACKGROUND ART

In recent years, optical disc devices have increased in capacity by virtue of a shorter wavelength of a light source, a larger NA of a lens and the like. For a shorter wavelength of a light source, digital versatile discs (DVDs) adopt an AlGaInP based red semiconductor laser at 650 nm for realizing information reproduction with a higher density, whereas compact disc devices adopt near-infrared light at 780 nm. In order to realize a next-generation optical disc device with a still higher density, the development of practical blue light sources have become imperative.

As one measure for realizing a blue laser, a quasi-phase-matched second-harmonic-generation (hereinafter abbreviated as QPM-SHG) technology is available, which is an optical waveguide quasi phase matching system using a wavelength conversion device. Compared with direct-emission type GaN based blue semiconductor lasers receiving attention recently, a SHG blue laser employing the QPM-SHG technology has the merits of low noise (−145 dB/Hz) and a small variation in wavelength and divergence angle, and a small driving voltage (2 V) of an AlGaAs based semiconductor laser that is the source of the fundamental wave. In order to allow a SHG blue laser to be used as a light source for optical discs, such a laser must be reduced in size and weight. In this regard, since a planar type direct-coupled SHG blue laser does not require a lens for a coupling system, sufficient miniaturization can be realized (See for example, JP 3156444 B, pp 4 to 6, FIG. 7).

FIG. 13 shows a configuration of a planar type direct-coupled SHG blue laser module. On a Si sub-mount 1, an optical waveguide QPM-SHG device 2 and a wavelength tunable DBR semiconductor laser 3 are mounted. The SHG device 2 is composed of a ridge type optical waveguide 5 and a periodically domain-inverted region 6 that are formed on an X-cut MgO-doped LiNbO$_3$ substrate 4. The LiNbO$_3$ substrate 4 is joined to the sub-mount 1 by an adhesive layer 7 made of an ultraviolet-curing adhesive. The sub-mount 1 is joined to a package 9 shaped like a box with an Ag paste 8. In a wall of the package 9, an aperture 9a is provided for letting light output from the SHG device 2 outside.

The SHG device 2 is configured so that a difference in propagation speed between a fundamental wave light and a second harmonic light generated by the semiconductor laser 3 can be compensated by the periodically domain-inverted region 6 so as to satisfy a quasi phase matching condition. Since the fundamental wave and the harmonics propagate through the ridge type optical waveguide 5 as guided waves, a long interaction length can be ensured, thus realizing a high conversion efficiency.

In order to allow such a SHG blue laser module to be smaller, lighter and have a lower cost, the miniaturization of various components is required. Then, an attempt has been made for the miniaturization of a SHG blue laser module, where the device width of the LiNbO$_3$ substrate 4 constituting the SHG device 2 was reduced from 3 mm to 0.85 mm and the width and the thickness of the Si sub-mount 1 were reduced from 5 mm to 2 mm and from 0.8 mm to 0.3 mm, respectively.

As a result of the miniaturization, the SHG device 2, the sub-mount 1 and the package 9 became vulnerable to an influence of swelling when the temperature increases. Because of the narrow device width of the SHG device 2, the bonding area of the adhesive layer 7 is reduced in the width direction, resulting in deterioration of the adhesive strength. Further, as a result of the decrease in thickness of the sub-mount 1, the sub-mount 1 becomes easy to bend even under a small stress, thus further increasing a tendency to generate misalignment of coupling between the SHG device 2 and the semiconductor laser 3 during a temperature change as compared with that in the conventional device size. The coupling misalignment during a temperature change occurs not only at the time of securing to the sub-mount 1 but also during various reliability tests for a module, such as a heat cycle test, a high temperature holding test and a high temperature and high humidity test.

In the optical waveguide wavelength conversion type SHG device, a blue light power as a harmonic power is proportional to the square of a coupled power of infrared light as fundamental wave, and therefore deterioration of the coupled power of the infrared light due to the coupling misalignment causes considerable deterioration of the output of the blue light. The coupling misalignment due to a temperature change in the operating environment also becomes likely to occur, so that temperature characteristics of the SHG blue laser are affected. That is to say, during the high temperature operation, e.g., during the operation at 60° C., deterioration of the output of the blue light becomes remarkable due to deterioration of the coupling efficiency between the semiconductor laser and the SHG device.

The deterioration of the coupling efficiency due to the coupling misalignment is not a problem limited to the SHG device, but this is serious also for the case where a semiconductor laser and an optical waveguide device, e.g., an optical fiber, are secured on a sub-mount for optical coupling.

DISCLOSURE OF THE INVENTION

An object of the present invention is to avoid coupling misalignment between a semiconductor laser and an optical waveguide device of a laser module resulting from a temperature increase during the manufacturing of the laser module, in which the semiconductor laser and the optical waveguide device are secured on a sub-mount for optical coupling, so as to improve the manufacturing yield of the laser module. Another object of the present invention is to suppress deterioration of a coupled power of infrared light and an output of blue light, resulting from coupling misalignment due to a temperature change during storage or operating of the manufactured module.

A laser module of the present invention includes: a sub-mount; a semiconductor laser secured to a surface of the sub-mount; and an optical waveguide device joined to the surface of the sub-mount by an adhesive layer so that the optical waveguide device is coupled optically with the semiconductor laser. A first groove is formed at the surface of the sub-mount at a region corresponding to an incident end side of the optical waveguide device, the first groove being formed parallel to an outgoing end face of the semiconductor laser with a predetermined space therefrom. The adhesive layer is formed so that an end of the adhesive layer on the incident end side of the optical waveguide device is positioned within a range from a position abutting with a distal edge of the first groove distant from the semiconductor laser to an inside of the first groove and does not contact with the outgoing end face of the semiconductor laser.

A laser module manufacturing method of the present invention is for manufacturing a laser module including: a sub-mount; a semiconductor laser secured to a surface of the sub-mount; an optical waveguide device joined to the surface of the sub-mount by an adhesive layer so that the optical waveguide device is coupled optically with the semiconductor laser, and a package to which the sub-mount is secured.

A first manufacturing method includes the steps carried out in this stated order: forming a groove at the surface of the sub-mount at a region corresponding to an incident end side of the optical waveguide device and securing the semiconductor laser at a predetermined position close to the groove so that an outgoing end face of the semiconductor laser is parallel to the groove; providing the adhesive layer so that an end of the adhesive layer on the incident end side of the optical waveguide device is positioned within a range from a position abutting with a distal edge of the first groove distant from the semiconductor laser to an inside of the first groove and does not contact with the outgoing end face of the semiconductor laser, and joining the optical waveguide device to the surface of the sub-mount by the adhesive layer; and securing the sub-mount to the package.

A second manufacturing method includes the steps carried out in this stated order: forming a groove at the surface of the sub-mount at a region corresponding to an incident end side of the optical waveguide device and securing the semiconductor laser at a predetermined position close to the groove so that an outgoing end face of the semiconductor laser is parallel to the groove; securing the sub-mount to the package; and providing the adhesive layer so that an end of the adhesive layer on the incident end side of the optical waveguide device is positioned within a range from a position abutting with a distal edge of the first groove distant from the semiconductor laser to an inside of the first groove and does not contact with the outgoing end face of the semiconductor laser, and joining the optical waveguide device to the surface of the sub-mount by the adhesive layer.

BEST MODE FOR CARRYING OUT THE INVENTION

Figure 1A:
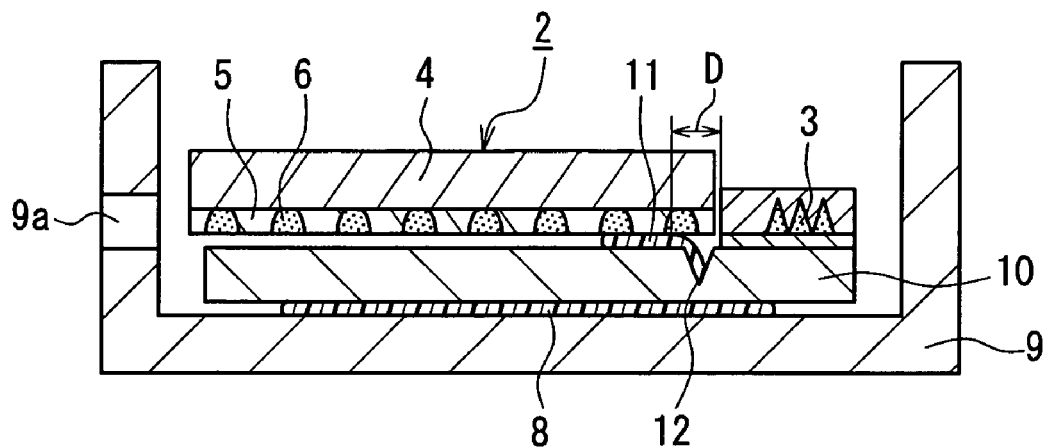
FIG. 1A. 1 is a cross-sectional view of a SHG blue laser module of Embodiment 1 of the present invention.

According to the laser module of the present invention, the first groove is formed at the surface of the sub-mount so as to be positioned close to the outgoing end face of the semiconductor laser. With this configuration, a position of the adhesive layer for securing the optical waveguide device can be controlled within a preferable range. As a result, coupling misalignment between the semiconductor laser and the optical waveguide device, resulting from distortion due to a thermal change, can be suppressed, so that reliability of the infrared light coupled output and the blue light output under storage environment and operating environment can be ensured.

Further, the groove formed can prevent the adhesive from coming around to the outgoing end face of the semiconductor laser when mounting the optical waveguide device, thus enhancing assembling yields when manufacturing a module.

In the laser module of the present invention, preferably, a distance D between the outgoing end face of the semiconductor laser and a proximal end of the adhesive layer satisfies 0 mm<D<0.2 mm. Further, the adhesive layer may be provided partially at one position close to an incident end face of the optical waveguide device.

Alternatively, the adhesive layer may be provided partially at least at two positions close to an incident end face of the optical waveguide device and close to the outgoing end face of the optical waveguide device. In that case, preferably, a second groove is formed at the surface of the sub-mount at a region corresponding to an outgoing end side of the optical waveguide device, the second groove being formed parallel to the outgoing end face of the optical waveguide device, and the adhesive layer close to the outgoing end face is provided along the second groove. It is preferable that an area of the adhesive layer close to the incident end face be larger than an area of the adhesive layer close to the outgoing end face.

Preferably, a third groove is formed at the surface of the sub-mount at a region corresponding to the incident end side of the optical waveguide device, the third groove being formed parallel to the first groove and being positioned between the first groove and the outgoing end face of the optical waveguide device. In that case, it is preferable that a distance L1 between the first groove and the third groove satisfy 1 mm<L1<L/2, where L denotes a length of the optical waveguide device.

Preferably, a fourth groove is formed at the surface of the sub-mount at a region corresponding to the outgoing end side of the optical waveguide device, the fourth groove being formed parallel to the second groove and being positioned between the second groove and the incident end face of the optical waveguide device. In that case, it is preferable that a distance L2 between the second groove and the fourth groove satisfy 1 mm<L2<L/2, where L denotes a length of the optical waveguide device.

Preferably, a thickness T1 of the optical waveguide device satisfies T1<1 mm. Preferably, a width W of the optical waveguide device satisfies W<0.85 mm. Preferably, a length L of the optical waveguide device satisfies L>10 mm. Preferably, a thickness T2 of the sub-mount satisfies T2<0.3 mm.

As the optical waveguide device, a quasi-phase-matched second harmonic generation (QPM-SHG) device may be used. Further, as the optical waveguide device, an optical fiber may be used.

According to the first laser module manufacturing method of the present invention, when an optical waveguide device is secured at two positions, bonding and securing on the incident end side are performed, followed by the securing of a sub-mount to a package, and then bonding and securing on the outgoing end side are performed. Therefore, coupling misalignment resulting from distortion due to a thermal change during the securing of the sub-mount to the package can be avoided, whereby reliability of the coupled output of the infrared light and the blue light can be ensured.

According to the second manufacturing method, after securing a sub-mount to a package, an optical waveguide device is bonded and secured on the sub-mount. Therefore, the effect of avoiding the coupling misalignment, resulting from distortion due to a thermal change during the securing of the sub-mount to the package, is larger than that of the first manufacturing method.

In the first and the second manufacturing methods, preferably, after completion of all of the steps, an adhesive is poured into a gap between a position close to an outgoing end face of the optical waveguide device and the sub-mount, whereby the position close to the outgoing end face of the optical waveguide device is secured to the sub-mount.

The following describes embodiments of the present invention more specifically, with reference to the drawings.

EMBODIMENT 1

Figure 1B:
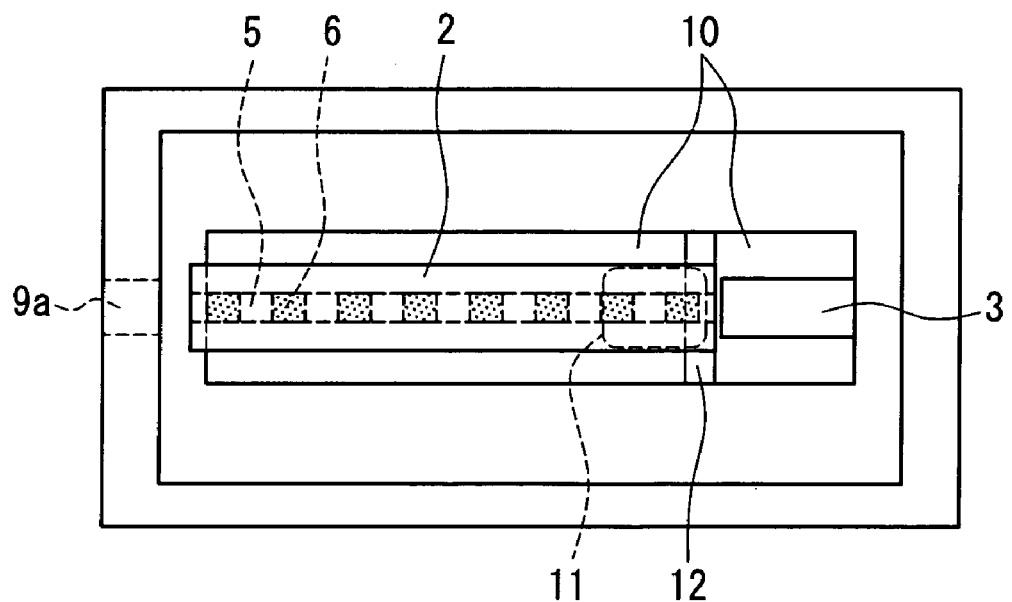
FIG. 1B is a plan view of the same.

Referring to FIGS. 1A and 1B, a SHG blue laser module of Embodiment 1 will be described below. FIG. 1A is a cross-sectional view and FIG. 1B is a plan view. The basic configuration of this laser module is similar to that of the conventional example shown in FIG. 13, and therefore the same reference numerals are assigned to similar elements for their explanations.

On a Si sub-mount 10, an optical waveguide QPM-SHG device 2 and a wavelength tunable DBR semiconductor laser 3 are mounted. The SHG device 2 as an optical waveguide conversion device is composed of a ridge type optical waveguide 5 and a periodically domain-inverted region 6 that are formed on an X-cut MgO-doped LiNbO$_3$ substrate 4. The LiNbO$_3$ substrate 4 is joined to a sub-mount 10 by an adhesive layer 11 made of an ultraviolet-curing adhesive. The sub-mount 10 is bonded to a package 9 shaped like a box with an Ag paste 8. In a wall of the package 9, an aperture 9a is provided for letting light output from the SHG device 2 outside.

In the present embodiment, a first groove 12 is formed at a surface of the sub-mount 10. The first groove 12 functions as a configuration for controlling the position of the adhesive layer 11 close to the outgoing end of the semiconductor laser 3 when the SHG device 2 is secured at one position on the sub-mount 10 by the adhesive layer 11. By controlling the position of the adhesive layer 11 in this way, the stability of the coupled power of the fundamental wave and the output of the blue light can be ensured when a temperature of the module changes. The effect will be described later.

The first groove 12 is formed perpendicular to the optical axis direction with the width of 0.2 mm and the depth of 50 μm, for example, and in the form of the letter V by etching. Therefore, the first groove 12 is parallel to the outgoing end face of the semiconductor laser 3. The first groove 12 normally may be disposed at a position abutting with the outgoing end face of the semiconductor laser 3, i.e., at a position with a space from the outgoing end face of the semiconductor laser 3 of 0. In general, the position of the first groove 12 can be set by considering how to apply an adhesive for forming the adhesive layer 11 so that the distance from the outgoing end face of the semiconductor laser 3 can be a predetermined space. This first groove 12 leads to the following two effects.

The first effect is to align the adhesive layer 11 with reference to the first groove 12, so as to facilitate the control of a distance D between the end of the adhesive layer 11 and the outgoing end face of the semiconductor laser 3 (see FIG. 1A) within a predetermined range. The distance D refers to a space between the outgoing end face of the semiconductor laser 3 and the proximal end of the adhesive layer 11, i.e., the end on the side facing the semiconductor laser 3. Note here that, since the portion of the adhesive layer 11 joined to the SHG device 2 contributes to the securing of the SHG device 2, the end is defined as an end of a portion of the adhesive layer 11 that contacts with the SHG device 2.

The adhesive layer 11 is provided so that its end contacts with the edge of the first groove 12 distant from the semiconductor laser 3. Herein, the end of the adhesive layer 11 generally forms a curve and not a line, and therefore "contacting" means the state where at least a part of the end contacts with the first groove 12. Further, "contacting" may be a "substantially contacting" state. That is to say, this is not limited to the state where the planar position of the edge of the first groove 12 and the end of the adhesive layer 11 agree with each other, but includes also the state where the end of the adhesive layer 11 enters into the first groove 12. The state where the end of the adhesive layer 11 is slightly apart from the edge of the first groove 12 also is included herein. That is to say, "substantially contacting" includes sufficient proximity of the end of the adhesive layer 11 to the first groove 12, which may include a some degree of error from which the effect of the alignment by the first groove 12 can be obtained. Thus, practically, the end of the adhesive layer 11 can be positioned within a range from the position abutting with the edge of the first groove 12 distant from the semiconductor laser 3 to the inside of the first groove 12. It should be noted here that the adhesive layer 11 needs to be disposed so as not to contact with the outgoing end face of the semiconductor laser 3.

Figure 2:
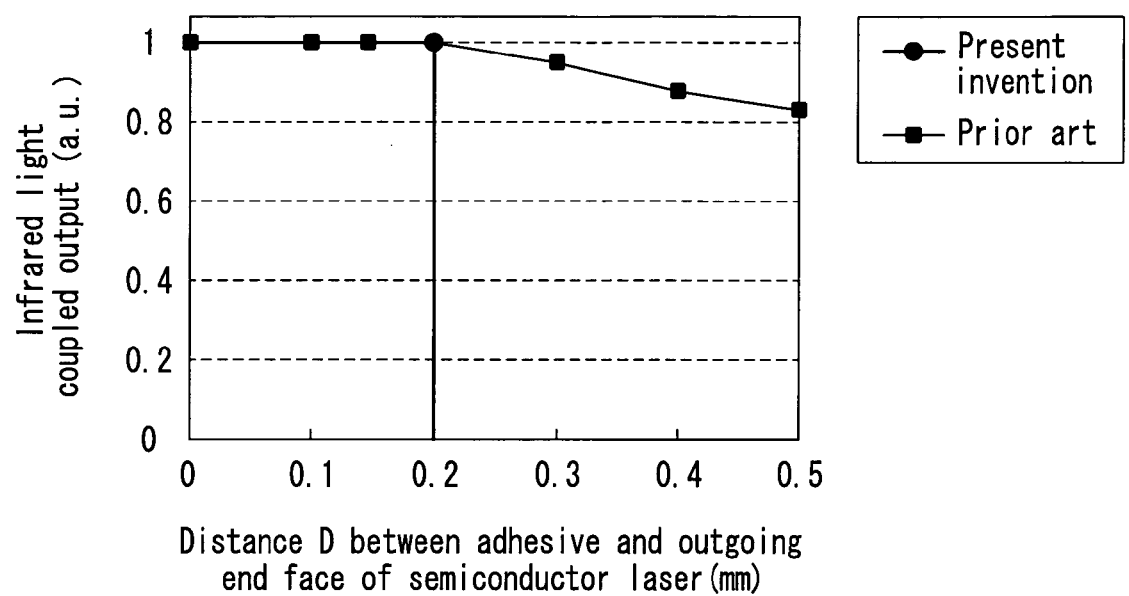
FIG. 2 shows a relationship of an infrared light coupled output versus a distance between an adhesive layer secured at one position and a semiconductor laser.

The position of the adhesive layer 11 preferably is controlled so that the above-stated distance D is within 0.2 mm. The provision of the first groove 12 facilitates such control of alignment. The effect of the distance D within 0.2 mm will be described below, with reference to FIG. 2. The horizontal axis of FIG. 2 shows the distance D between the semiconductor laser 3 and the adhesive layer 11. The circle mark ● shows the distribution of the distance D in the module of the present embodiment. It is found that the distance D can be controlled at about 0.2 mm.

The vertical axis of FIG. 2 shows the relationship of the infrared light coupled output versus the distance D. In order to investigate this relationship, a sub-mount with the SHG device 2 mounted thereon was aligned in a package, followed by a heat treatment at 80° C. for 2 hours (Ag paste curing condition). As shown in FIG. 2, when the distance D was not more than 0.2 mm, the infrared light coupled output after securing to the package was the same as the output prior to the securing to the package. This shows that the sub-mount can be secured in the package without coupling misalignment. As stated above, the module of the present embodiment allows the distance D to be controlled at about 0.2 mm, and therefore the coupling misalignment can be suppressed sufficiently. Incidentally, if the distance D is not more than 0.2 mm, the infrared light coupled output can be maintained as shown in FIG. 2. Therefore, it is possible to control so that the distance D becomes not more than 0.2 mm.

On the other hand, square marks ■ of FIG. 2 show the distribution of the distance D in the module manufactured to have the module configuration (FIG. 13) using the conventional sub-mount. Since the first groove 12 is not formed, the application position of the adhesive cannot be controlled, so that the distance D varies beyond 0.2 mm. In the case of the distance D exceeding 0.2 mm, the coupling misalignment of the SHG device 2 after the securing to the package will be large, thus increasing deterioration of the infrared light coupled output.

The LiNbO$_3$ substrate constituting the SHG device, the Si sub-mount and Cu as a material of the package have different linear expansion coefficients. For that reason, during the heat treatment process for securing to the package, since the temperature rises from 25° C. as a room temperature to 80° C., each material has a different swelling amount, so that distortion occurs where the secured point by the adhesive serves as a base point. In the case where the adhesive layer is closer to the outgoing end face of the semiconductor laser, the secured position of the SHG device can be held even when distortion occurs during the temperature rise, so that coupling misalignment does not occur. However, if the adhesive layer is distant from the outgoing end face of the semiconductor laser, the coupling misalignment due to distortion increases along with deterioration of the infrared light coupled output during the temperature rise.

The main factors of increasing the tendency of the coupling misalignment occurring due to distortion include the following conditions:

1) Deterioration of adhesive strength resulting from a decrease of the bonding area due to the narrow SHG device width (e.g., 0.85 mm);

2) Bending of the SHG device in the optical axis direction due to the long SHG device length (10 to 12 mm); and 3) Distortion of the Si sub-mount due to the thin Si sub-mount (e.g., 0.3 mm).

In order to realize the miniaturization of the module, the narrowing of the SHG device width and the thinning of the Si sub-mount are necessary as shown in 1) and 3). Further, in order to realize a higher output of the module, a high conversion efficiency is necessary, and therefore it is necessary to ensure the SHG element length as in 2) also so as to lengthen the interaction length. As in the present embodiment, the first groove 12 is formed in the Si sub-mount 10 so as to control the position of the adhesive layer 11, whereby the coupling misalignment of the SHG device 2 after the securing to the package can be avoided while ensuring the device configurations shown in 1) to 3).

In view of the above, the configuration of the present embodiment is especially effective for the application to the following module.

The thickness T1 of an optical waveguide device is T1<1 mm. Such a thin optical waveguide device has a small substrate thickness, and therefore it is effective in terms of the cost and the miniaturization of the module.

The width W of the optical waveguide device is W<0.85 mm. Since one wafer can yield an increased number of devices, this configuration leads to the reduction of cost and is effective for the miniaturization of the module.

The length L of the optical waveguide device is L>10 mm. A longer length of the optical waveguide device enables the enhancement of a conversion efficiency and is effective for obtaining a higher output.

The thickness T2 of the sub-mount is T2<0.3 mm. Since the sub-mount substrate can be made thinner, this is effective in terms of the cost and the miniaturization of the module.

The second effect of the provision of the first groove 12 is to have a function of preventing an ultraviolet-curing adhesive for forming the adhesive layer 11 from flowing into the end face of the semiconductor laser 3 during the mounting of the SHG device 2 after the application of the adhesive thereto. This will be described below.

Figure 13:
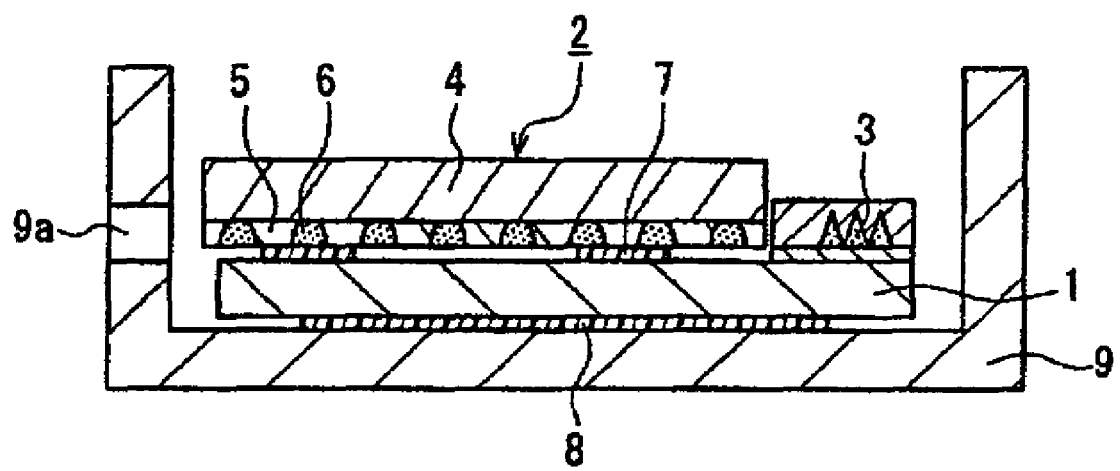
FIG. 13 is a cross-sectional view of a conventional SHG blue laser module.

For the case of using the sub-mount 1 without the groove as shown in FIG. 13, an attempt was made so as to bring the adhesive layer 7 closer to the outgoing end face of the semiconductor laser 3 within 0.2 mm, which was for avoiding the coupling misalignment during a temperature change. To this end, when the adhesive was applied closer to the outgoing end face of the semiconductor laser 3, the adhesive moved toward the semiconductor laser 3 during the alignment of the SHG device 2 and often came around to the end face of semiconductor laser 3. When the adhesive comes around to the end face of the semiconductor laser 3, the outgoing end face deteriorates during the light emission of the semiconductor laser 3, thus causing a deterioration in power. On the other hand, in the case of the groove formed as in the present embodiment, the coming around of the adhesive to the end face of the semiconductor laser 3 can be avoided, whereby yields of assembling the SHG device 2 can be improved.

The position of the first groove 12 preferably is set so that the distance from the outgoing end face of the semiconductor laser 3 is within the range of 0 to 0.2 mm. Such a range makes it easy to control the distance D between the end of the adhesive layer 11 and the outgoing end face of the semiconductor laser 3 within 0.2 mm with reference to the first groove 12. Further, the width of the first groove 12 preferably is smaller than 0.2 mm. A groove width exceeding this makes it difficult to control the distance between the adhesive layer 11 and the semiconductor laser 3 to be less than 0.2 mm, thus causing the misalignment when a temperature changes. A narrower groove width makes it easier to control the position of the adhesive layer 11 at a desirable position, but the adhesive becomes likely to come around to the semiconductor laser 3 side or to the waveguide portion of the SHG device 2. In such a case, the coming around of the adhesive can be avoided by providing an escape groove or by deepening the groove. Note here that the adhesive flowing into the first groove 12 also functions to join the SHG device 2 depending on the thickness of the adhesive layer, and therefore the position of the adhesive layer 11 should be set with consideration given to this.

Further, according to the present embodiment, the adhesive layer 11 is positioned close to the incident end face of the SHG device 2 as well (at the position of 0.2 mm from the incident end). This is because the outgoing end face of the semiconductor laser 3 and the incident end face of the SHG device 2 normally are coupled directly with a space of about 0 μm therebetween. Since the adhesive layer 11 is positioned close to the incident end face of the SHG device 2, an influence of the swelling of the SHG device 2 in the optical axis direction during a temperature rise can be alleviated as follows.

A portion of the SHG device 2 located on the incident end side with reference to the position secured by the adhesive swells longer with decreasing proximity of the secured position to the incident end face of the SHG device 2. The linear expansion coefficient of the SHG device 2 is $14 \times 10^{-6}$. Therefore, in the case where the secured position is 0.5 mm away from the incident end face of the SHG device 2, the SHG device 2 expands by about 0.4 µm in the optical axis direction, i.e., toward the outgoing end face of the semiconductor laser 3 during the temperature rise from 25° C. to 80° C. Since the space between the incident end face of the SHG device 2 and the outgoing end face of the semiconductor laser 3 is about 0 µm, a possibility of the breakage of the semiconductor laser 3 and the SHG device 2 and the coupling misalignment increases with increasing the distance of the swelling of the SHG device 2 toward the semiconductor laser 3 during a temperature rise. According to the present embodiment, since the position of the adhesive layer 11 can be controlled at the position of 0.2 mm from the incident end face of the SHG device 2, the swelling amount in the optical axis direction during the temperature rise from 25° C. to 80° C. is no more than 0.1 µm. Therefore, the possibility of the coupling misalignment and the breakage due to contact between the SHG device 2 and the semiconductor laser 3 is significantly low.

The following describes various types of reliability of the SHG blue laser module manufactured according to the present embodiment. In order to allow the SHG blue laser module to be mounted on an optical disc device, various types of reliability under storage and under operating conditions should be ensured.

Firstly, the reliability of the coupled power under storage environment and of the blue light output is described below. For the SHG blue laser module manufactured according to the present embodiment, reliability tests of the coupled power were conducted, including a high-temperature continuous test (100° C.×500 H) and a heat cycle test (−45° C. to 80° C.(1 cycle)×200 cycles) and a test under high temperature and high humidity environment (60° C., 90%×500 H). As a result, it was confirmed that the coupled power after the above-stated reliability tests was stable without a change. Thus, it was shown by the tests that the module configuration of the present embodiment had sufficient reliability.

Figure 3A:
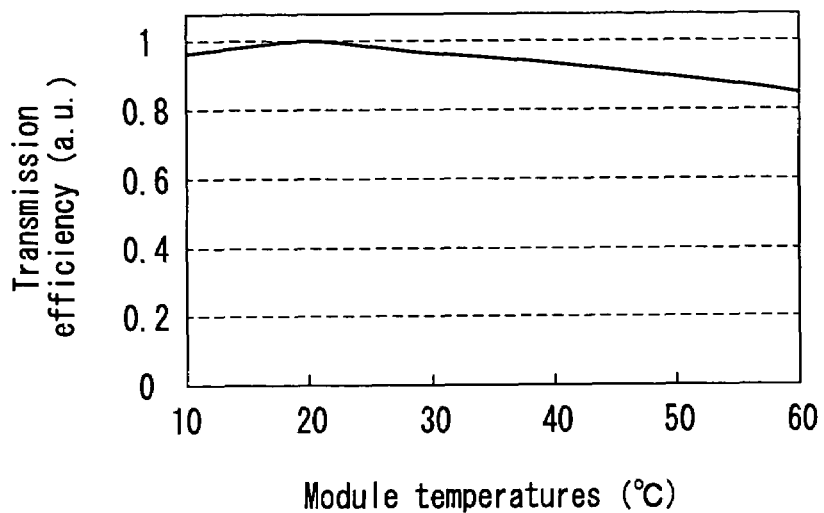
FIG. 3A shows temperature characteristics of a conventional SHG blue laser module.
Figure 3B:
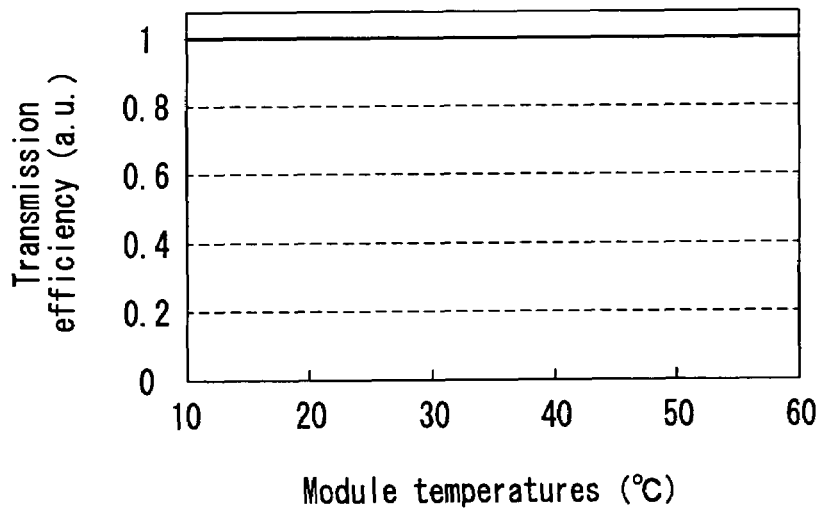
FIG. 3B shows temperature characteristics of the SHG blue laser module of Embodiment 1.

When mounting to an optical disc device, temperature characteristics of the SHG laser module also are important. While the operating temperature of the SHG laser module was varied from 10 to 60° C., the coupled power characteristics of the infrared light were measured. FIG. 3A and FIG. 3B show the temperature characteristics of the transmission efficiency of the SHG device from 10° C. to 60° C. FIG. 3A shows the temperature characteristics of the SHG device in the module where the position of the adhesive layer, i.e., the distance D of FIG. 1, was 0.5 mm. The transmission efficiency is the value obtained by dividing the infrared coupled output of the finished module by the output of the infrared light from the semiconductor laser alone. Deterioration of the transmission efficiency indicates degradation of the temperature characteristics of the module.

From FIG. 3A, it is found that as a temperature change with reference to a room temperature increases, the deterioration of the transmission efficiency increases. The deterioration in coupling due to an increase of the propagation loss within the optical waveguide during the temperature change or due to a change of the spot size of the laser and the guided mode size of the optical waveguide are so small that they can be ignored. Therefore, it can be considered that the deterioration of the transmission efficiency results from the deterioration of the coupling efficiency because the secured position of the SHG device 2 changes because of the thermal expansion and contraction of the SHG device, the adhesive layer and the Si sub-mount during the temperature change.

On the other hand, the module of the present embodiment, in which the position of the adhesive layer was close to the outgoing end of the semiconductor laser 3, was free from the degradation of the temperature characteristics of the transmission efficiency of the SHG blue laser module from 10° C. to 60° C., and a stable transmission efficiency independent of temperatures could be obtained. That is to say, it was confirmed that the coupled power was stable even under the module operating environment (herein from 10° C. to 60° C.), and it was shown that the module configuration of the present embodiment had favorable temperature characteristics.

In the present embodiment, an example of a short wavelength laser module in which the wavelength tunable DBR semiconductor laser 3 and the optical waveguide QPM-SHG device 2 were coupled directly is described. However, this is not a limited example, and the idea of the present embodiment is applicable similarly to other embodiments as long as it concerns a laser module in which a semiconductor laser and an optical waveguide device are coupled directly. For instance, the present embodiment is applicable to all types of semiconductor lasers irrespective of the types and wavelengths of semiconductor lasers. Also, as for the optical waveguide devices, the present embodiment is not limited to a ridge type optical waveguide but is applicable to the case of all types of optical waveguide devices used, including a proton exchanged optical waveguide and an optical fiber. Also for a material of a substrate of the optical waveguide device, the present embodiment is not limited to $LiNbO_3$ but is applicable to the case of other optical waveguide materials used such as a quartz based optical waveguide.

Further, the laser module of the present embodiment is not limited to the application to an optical disc device, but is applicable to all types of direct coupling type optical waveguide laser modules in the field of optical communication and the like.

Although the above embodiment shows an example where Si and Cu having excellent thermal conductivity are used as materials of the sub-mount 10 and the package 9, the materials are not limited to these. In order to minimize the distortion of the module due to heat, it is more desirable that a sub-mount material and a package material that have linear expansion coefficients closer to that of the optical waveguide device material be selected.

The method for forming the first groove 12 on the sub-mount 10 is not limited to the above-stated etching, but the formation using a cutter or the like also is applicable.

Further, in the above-stated example, the first groove 12 of 0.2 mm in width is formed so that the adhesive layer 11 close to the incident end of the SHG device 2 can be aligned at the position of 0.2 mm from the outgoing end face of the semiconductor laser 3. Regarding this, by decreasing the width of the first groove 12 so as to increase the proximity to the semiconductor laser 3, the reliability of the coupled power at a still higher temperature rise (100° C. or higher) can be ensured. Further, the optimization of the application amount of the adhesive, which makes the length of the adhesive layer 11 in the width direction of the SHG device 2, i.e., the direction perpendicular to the optical axis, equal to the width of the SHG device 2, can maximize the adhesive strength, which is effective for ensuring the reliability of the coupled power.

EMBODIMENT 2

A SHG blue laser module according to Embodiment 2 will be described below, with reference to FIGS. 4A and 4B. This laser module has the basic configuration similar to that of Embodiment 1 shown in FIGS. 1A and 1B. Therefore, the same reference numerals are assigned to similar elements to simplify their explanations. Also in this embodiment, similarly to Embodiment 1, an optical waveguide device is an optical waveguide QPM-SHG device 2 manufactured using a MgO-doped $LiNbO_3$ substrate 4, and a semiconductor laser 3 is a DBR semiconductor laser having a wavelength tunable function, which is described below as one example.

In the present embodiment, the SHG device 2 is secured on a Si sub-mount 10 at two positions of an adhesive layer 11 and an adhesive layer 13, made of an ultraviolet curing adhesive. Then, similarly to Embodiment 1, the present embodiment has the configuration where the position of the adhesive layer 11 on one side is controlled close to the outgoing end of the semiconductor laser 3 by a first groove 12 provided in the sub-mount 10. With this configuration, the stability of the coupled power of the basic wave and the blue light output during a temperature change of the module can be ensured. The adhesive layer 13 on the other side is disposed close to the outgoing end of the SHG device 2.

Figure 5:
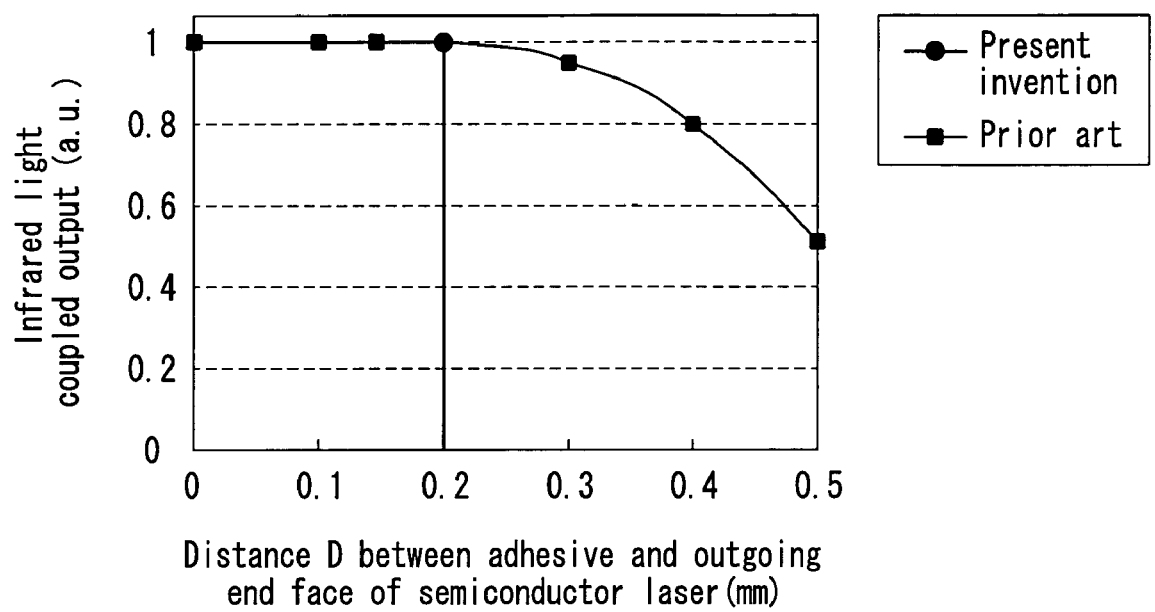
FIG. 5 shows a relationship of a coupled power versus a distance between an adhesive layer secured at two positions and a semiconductor laser.

As stated above, in the conventional module configuration, since the position of the adhesive layer 11 at the incident end cannot be controlled, the coupled power and the blue light output deteriorate because of distortion of materials due to a temperature change of the module or heat applied at the time of securing to a package. Especially, in the case where the SHG device 2 is secured at two positions as in the present embodiment, there is no position to release a stress because the module materials are distorted where the two secured points serve as base points. For that reason, compared with the case of securing at one position, the position of the adhesive layer significantly affects the deterioration of the coupling. FIG. 5 shows a relationship of the infrared light coupled output with respect to a distance D between the outgoing end face of the semiconductor laser 3 and the end of the adhesive layer 11. As shown in FIG. 5, as compared with the case of securing at one position of FIG. 2, the coupling misalignment occurring after the securing to the package depends on the distance between the adhesive layer 11 and the semiconductor laser 3 more remarkably.

Therefore, the configuration with the first groove 12 (width 0.2 mm×depth 50 μm) formed parallel to the outgoing end face of the semiconductor laser 3 on the Si sub-mount 10, which is for avoiding the coupling misalignment and for avoiding the coming around of the adhesive, is much more effective than Embodiment 1 concerning the effect of the avoiding of the coupling misalignment.

The configuration of securing the SHG device at two positions is especially effective for recording/reproducing with respect to an optical disc with two recording layers when the SHG laser is mounted on an optical disc device. That is, it is necessary for optical pickups to have excellent signals even at the time of a temperature change of a drive. In the case of the application to the optical disc device, the stability of a luminous point against a temperature change of the module is required. In an optical disc system with two recording layers and a large NA lens (e.g., NA=0.85, wavelength: 410 nm), the displacement amount of a luminous point relative to the temperature change of −10° C. to 70° C. (±40° C.) should be controlled within ±1 μm both in the horizontal direction and the vertical direction. A large displacement amount of the luminous point causes the failure of the tracking servo for an optical disc, thus making a reproducing/recording operation unstable.

Normally, however, optical pickups are vulnerable to the displacement of the luminous point due to a temperature change. Especially, in the case of a SHG blue laser with the SHG device 2 secured at one position close to the incident end, the displacement amount of the luminous point tends to increase due to a bimetal effect. For instance, a measurement result of 1 μm or more of the displacement amount of a luminous point has been obtained when the temperature changed by ±40° C. As a result, in some cases, the displacement of the luminous point exceeds the tolerance of a blue light double-layered disc, resulting in a failure of the servo.

On the other hand, when the SHG device 2 is secured also at a position close to the outgoing end face, the bimetal effect can be suppressed, thus suppressing the displacement of the luminous point, whereby excellent signals can be obtained. For instance, a measurement result of the displacement amount of the luminous point of 1 μm or less has been obtained when the temperature changed by ±40° C. Therefore, it is significantly important for a blue laser module used in an optical disc device ready for double layered discs to secure the SHG device 2 at least at two positions including positions close to the incident and outgoing end faces.

Not only in the field of optical discs but also in other fields of printers and exposures, it is desirable to secure a position dose to a luminous point. This is because since the device design and the positioning of components are performed with reference to the luminous point of a laser light source, the displacement of the luminous point due to heat leads to a high possibility of operational problems of all products. Therefore, the module with two secured positions has excellent usefulness because the displacement amount of the luminous point due to a temperature change is small.

As stated above, according to the present embodiment, the reliability of the coupled power and the blue light power at the time of a temperature change can be ensured, while the displacement amount of a luminous point can be suppressed within a desired range. Therefore, the present embodiment is more practical than Embodiment 1.

In order to enhance the reliability of the configuration secured at two positions, it is effective that the area of the adhesive layer 11 on the incident end side is made larger than the area of the adhesive layer 13 on the outgoing end side. Since the coupling misalignment is ascribable mainly to the displacement of the SHG device 2 on the incident end side, it is significantly effective to increase the adhesive strength by increasing the area of the adhesive layer 11 on the incident end side.

Further, in addition to the securing at two positions, securing at three positions where another secured position is provided at a center portion of the SHG device 2, the securing by the entire face of the SHG device 2 and the like are possible in order to alleviate the distortion due to thermal expansion. However, if the secured positions are increased, problems would occur such that a cycle time increases or the amount of an adhesive increases, which may result in a failure of orderly alignment of the SHG device 2. Therefore, the securing at two positions is the best for the securing at plural positions.

Further, when securing the SHG device 2, the curing of the adhesive layer 11 on the incident end side prior to the curing of the adhesive layer 13 on the outgoing end side is significantly effective for improving the assembling yields of the SHG device 2. This is because such a procedure allows the displacement of the optical coupling to be avoided, which occurs due to heat generated when the adhesive layer 11 on the outgoing end side is irradiated with ultraviolet rays.

Figure 4A:
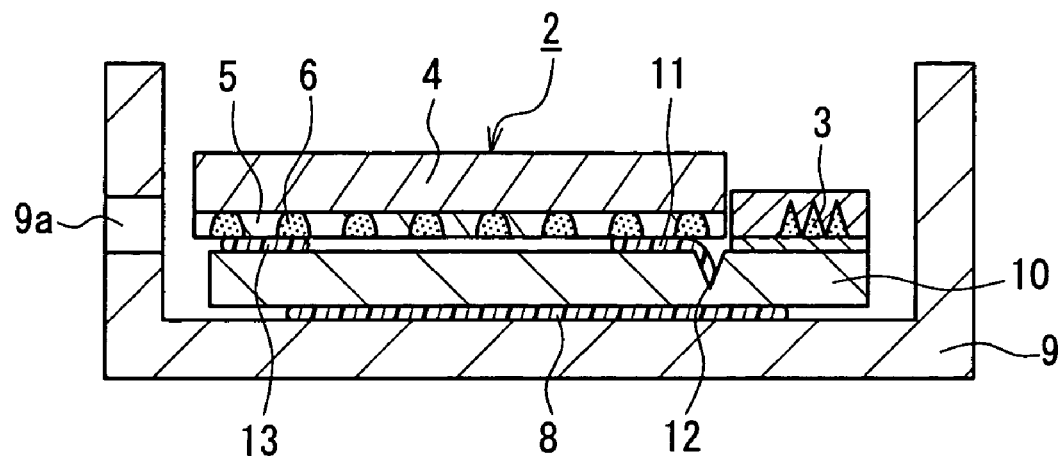
FIG. 4A is a cross-sectional view of a SHG blue laser module of Embodiment 2 of the present invention.
Figure 4B:
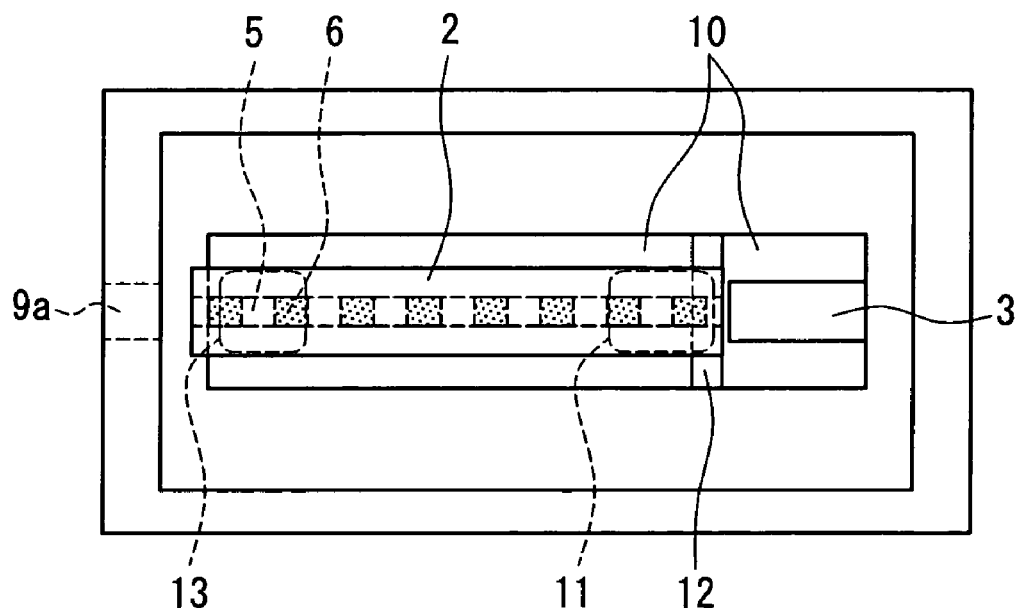
FIG. 4B is a plan view of the same.
Figure 6A:
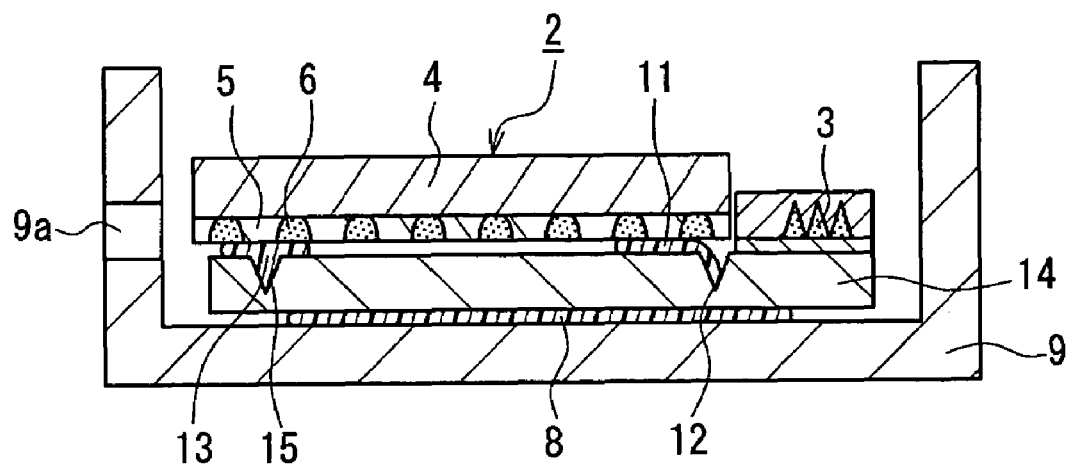
FIG. 6A is a cross-sectional view of another exemplary SHG blue laser module of Embodiment 2 of the present invention.
Figure 6B:
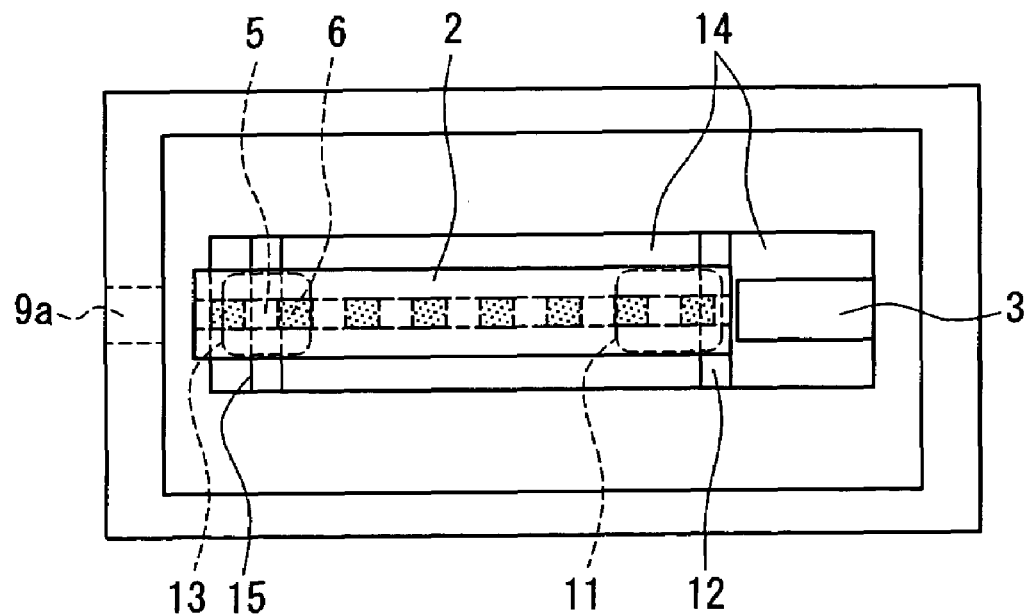
FIG. 6B is a plan view of the same.

Herein, it is effective to replace the Si sub-mount 10 in FIGS. 4A and 4B with a Si sub-mount 14 shown in FIGS. 6A and 6B. The Si sub-mount 14 has a second groove 15 formed at a position corresponding to the adhesive layer 13 on the outgoing end side. Thereby, the adhesive layer 13 for securing the SHG device 2 on the outgoing end side can be aligned accurately in the optical axis direction. As the proximity of the adhesive layer 13 to the outgoing end face of the SHG device 2 increases, the displacement amount of the luminous point decreases. Therefore, the position of the second groove 15 may be determined in accordance with the tolerance of the displacement of the luminous point, so as to control the position of the adhesive layer 13.

EMBODIMENT 3

A method for manufacturing a SHG blue laser module according to Embodiment 3 will be described below, with reference to FIGS. 7A and 7B. This manufacturing method is targeted at a laser module having the configuration where the SHG device 2 is secured at two positions as shown in FIGS. 4A and 4B. According to the present embodiment, when the SHG device 2 is secured to the Si sub-mount 10 at two positions, firstly, the SHG device 2 is secured at one position close to the incident end of the SHG device 2 using an adhesive. Next, following the securing of the sub-mount 10 to the metal package 9, the SHG device 2 on the outgoing end side is secured using an adhesive. With this procedure, the function of the first groove 12 formed in the sub-mount 10 can be exploited, and an influence of distortion due to heat applied during the manufacturing process can be reduced.

Figure 7A:
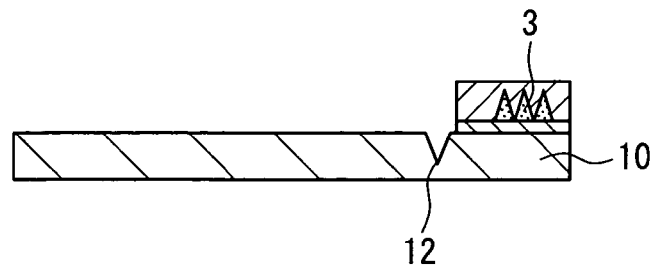
FIG. 7 shows manufacturing steps of a SHG blue laser module of Embodiment 3.

Firstly, as shown in FIG. 7A, the first groove 12 is formed at a surface of the Si sub-mount 10. Next, with reference to the first groove 12, the wavelength tunable semiconductor laser 3 is mounted.

Figure 7B:
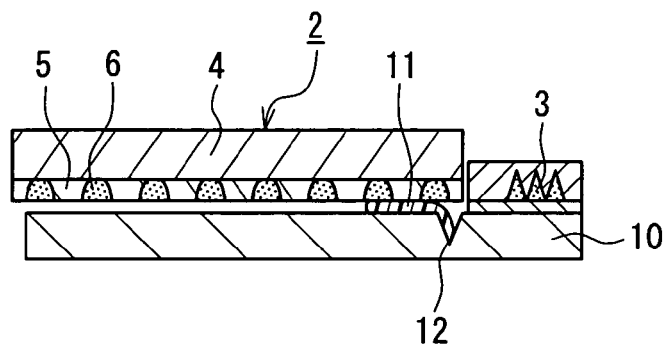

Next, as shown in FIG. 7B, the SHG device 2 is mounted on the Si sub-mount 10 accurately with respect to the semiconductor laser 3. At this time, the SHG device 2 is secured at one position on the incident end side using the adhesive layer 11 made of an ultraviolet curing resin that is formed with reference to the first groove 12. Since the adhesive layer 11 is aligned using the first groove 12, the SHG device 2 can be secured while keeping a distance of 0.2 mm from the outgoing end face of the semiconductor laser 3.

Figure 7C:
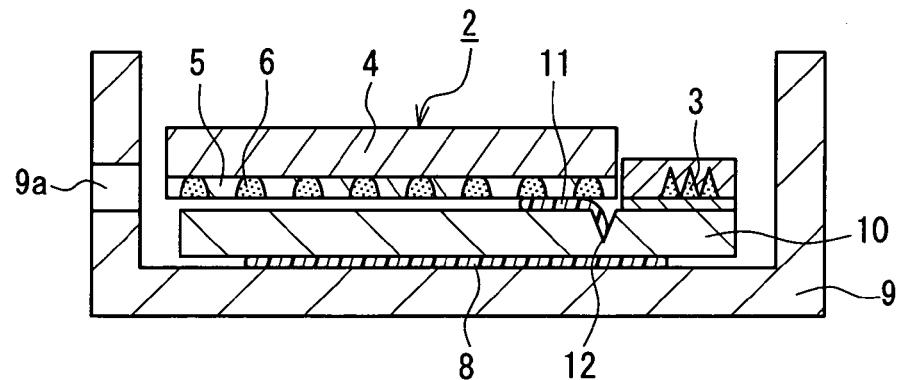

Next, as shown in FIG. 7C, the sub-mount 10, on which the semiconductor laser 3 and the SHG device 2 have been mounted, is secured at a predetermined position of the package 9 by thermally curing the Ag paste 8 at 80° C. for 2 hours.

Figure 7D:
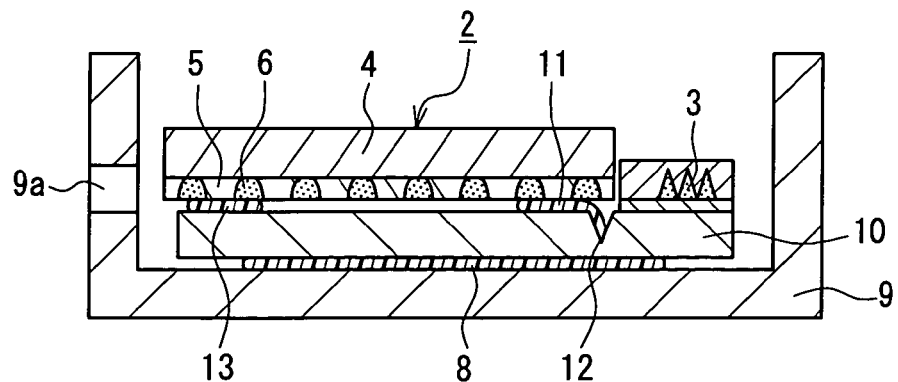

Next, as shown in FIG. 7D, an ultraviolet curing resin is poured into a gap between the sub-mount 10 and the SHG device 2 at a room temperature, followed by curing of the poured adhesive by the irradiation with ultraviolet rays, whereby the SHG device 2 is secured at a position close to the outgoing end face using the adhesive layer 13.

As compared with a method of securing the SHG device 2 to the Si sub-mount 10 at two positions, followed by the securing of the sub-mount 10 to the metal package 9, this manufacturing method realizes higher stability of the manufactured SHG blue laser module at a room temperature. That is, when the Si sub-mount 10 is heated to 80° C. for securing to the package 9, which is then allowed to reach a room temperature, each of the SHG device 2, the Si sub-mount 10 and the metal package 9 becomes distorted because of a difference in the linear expansion coefficient therebetween. At this time, if the SHG device 2 is secured at two positions, such distortion cannot be released, which may lead to a tendency for a partial stress to be applied, thus causing the coupling misalignment. On the other hand, according to the manufacturing method of the present embodiment, the above procedure is performed on the SHG device 2 that is secured at one position of the incident end portion, and therefore the tendency for partial stress to be applied can be decreased. Therefore, the coupling misalignment can be suppressed.

EMBODIMENT 4

A method for manufacturing a SHG blue laser module according to Embodiment 4 will be described below, with reference to FIGS. 8A and 8B. This manufacturing method also is targeted at a laser module having the configuration where the SHG device 2 is secured at two positions as shown in FIGS. 4A and 4B. According to the present embodiment, the Si sub-mount 2 firstly is secured to the package 9, and then the SHG device 2 is secured to the Si sub-mount at two positions. Thereby, as compared with the manufacturing method of Embodiment 3, the module becomes more resistant to an influence of the distortion due to heat, whereby high reliability of the coupled power can be ensured.

Figure 8A:
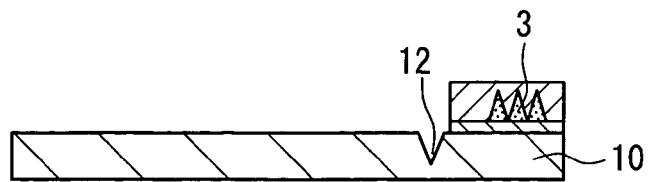
FIG. 8 shows manufacturing steps of a SHG blue laser module of Embodiment 4.

Firstly, as shown in FIG. 8A, the first groove 12 is formed at a surface of the Si sub-mount 10. Next, with reference to the first groove 12, the wavelength tunable semiconductor laser 3 is mounted.

Figure 8B:
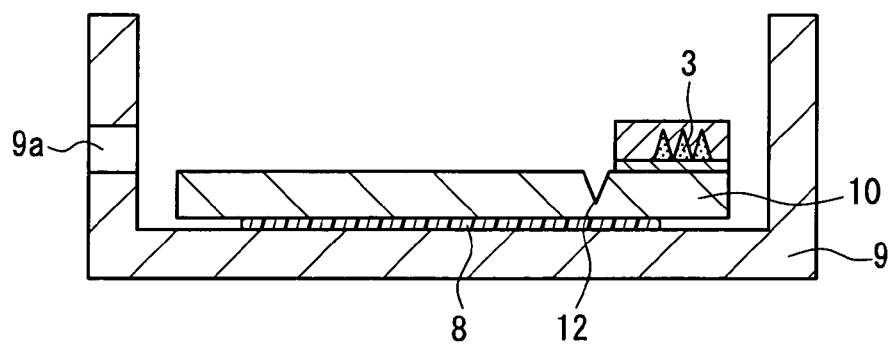

Next, as shown in FIG. 8B, the sub-mount 10 is secured at a predetermined position of the package 9 by thermally curing the Ag paste 8 at 80° C. for 2 hours.

Figure 8C:
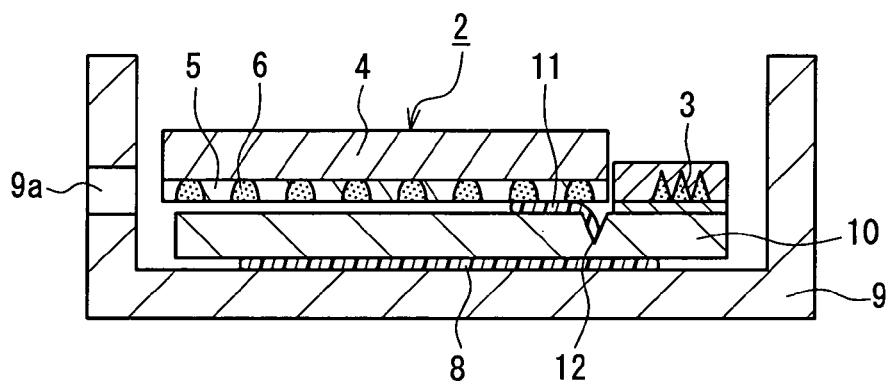

Next, as shown in FIG. 8C, at a room temperature, the SHG device 2 is mounted on the sub-mount 10 secured in the package 9 accurately with respect to the semiconductor laser 3. At this time, the SHG device 2 is secured at one position on the incident end side using the adhesive layer 11 made of an ultraviolet curing resin that is formed with reference to the first groove 12. Since the adhesive layer 11 is aligned using the first groove 12, the SHG device 2 can be secured while keeping a distance of 0.2 mm from the outgoing end face of the semiconductor laser 3.

Figure 8D:
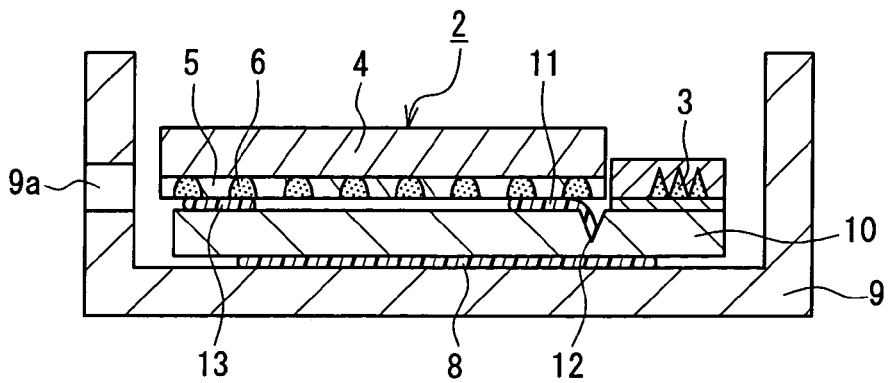

Next, as shown in FIG. 8D, an ultraviolet curing resin is poured into a gap between the sub-mount 10 and the SHG device 2, followed by curing of the poured adhesive by the irradiation with ultraviolet rays, whereby the SHG device 2 is secured at a position close to the outgoing end face using the adhesive layer 13.

The reasons for the greater stability of the module at a room temperature of the SHG blue laser manufactured by the method of the present embodiment than the module manufactured by the method of Embodiment 3 follow: that is, in Embodiment 3, at the time of the heat treatment at 80° C. for securing the sub-mount 10 to the package 9, the SHG device 2 is secured at one position close to the incident end side. Even one secured position may cause slight distortion in the SHG device 2 because of a difference in linear expansion coefficients of the SHG device 2, the Si sub-mount and the metal package when they are allowed to reach a room temperature.

On the other hand, according to the manufacturing method of the present embodiment, since the heat treatment is applied prior to the securing of the SHG device 2, the SHG device 2 can be free from a stress resulting from the distortion due to a difference in linear expansion coefficients between elements. Therefore, for a laser module obtained by securing the SHG device 2 at two positions close to the incident and outgoing ends and then by packaging, high reliability at a room temperature can be realized.

Herein, in the present embodiment, a method of securing the SHG device 2 concurrently at two positions close to the incident end and the outgoing end thereof using an ultraviolet curing resin also can be used.

EMBODIMENT 5

Figure 9A:
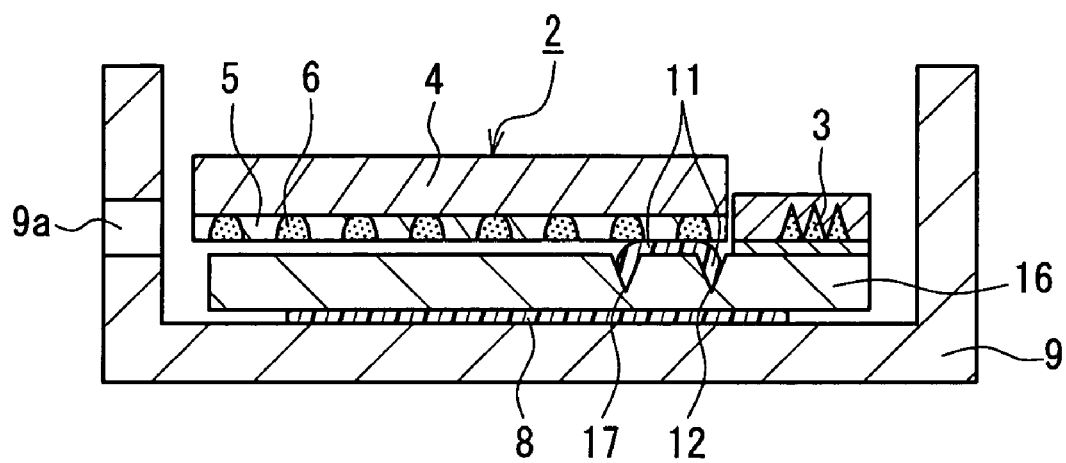
FIG. 9A is a cross-sectional view of a SHG blue laser module of Embodiment 5 of the present invention.
Figure 9B:
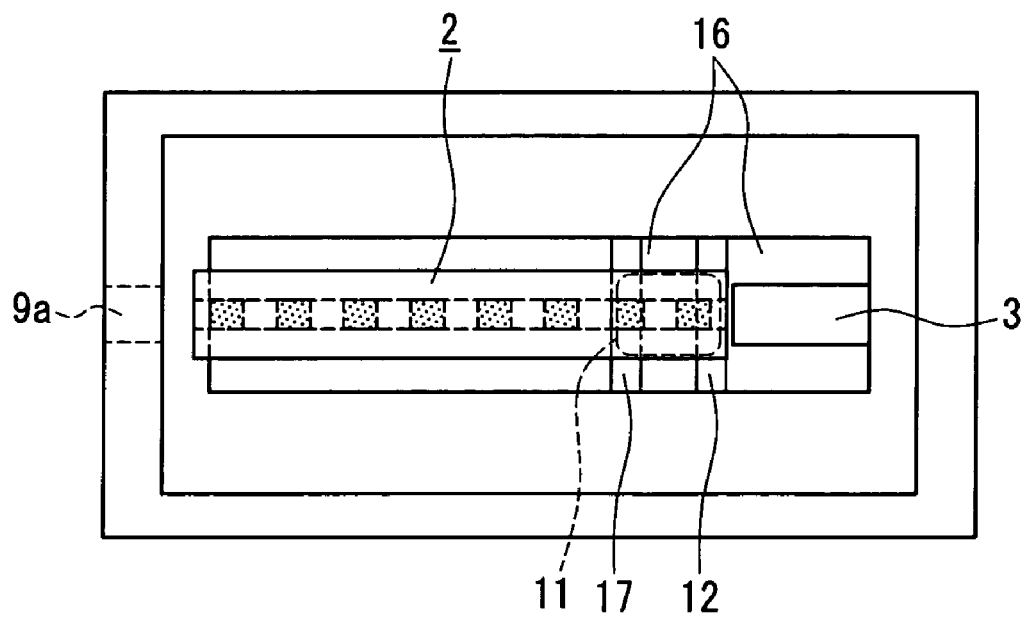
FIG. 9B is a plan view of the same.

A laser module according to Embodiment 5 will be described below, with reference to FIGS. 9A and 9B. This laser module has an improved configuration relative to that shown in FIGS. 1A and 1B. The improved point is that a third groove 17 is formed in a Si sub-mount 16 to be parallel to the first groove 12. The third groove 17 is positioned at a region corresponding to the incident end side of the SHG device 2 and between the first groove 12 and the outgoing end face of the SHG device 2. The first groove 12 and the third groove 17 have a width of 0.2 mm and a depth of 50 μm, which are formed by etching. A distance L1 between the third groove and the first groove 12 is set within a range of 1 mm<L1<L/2, where L denotes the length of the SHG device 2.

As described in Embodiment 1, the provision of the first groove 12 allows the securing of the SHG device 2 while keeping a distance between the semiconductor laser 3 and the adhesive layer 11 at 0.2 mm. Further, the provision of the third groove 17 enables the control of the bonding area. That is, desired dimensions of the adhesive layers and such a bonding area can be obtained accurately by appropriate setting of the distance L1.

As one example according to the present embodiment, the module was manufactured where L1=2 mm. Thereby, the dimension of the adhesive layer 11 in the longitudinal direction of the SHG device 2 could be controlled constant, so that a stable adhesive strength could be obtained. Further, by forming a pair of symmetric grooves, a thickness distribution of the adhesive layer 11 could be made uniform and a more stable adhesive strength could be obtained. In order to achieve a sufficient adhesive strength, L1>1 mm was effective.

EMBODIMENT 6

Figure 10A:
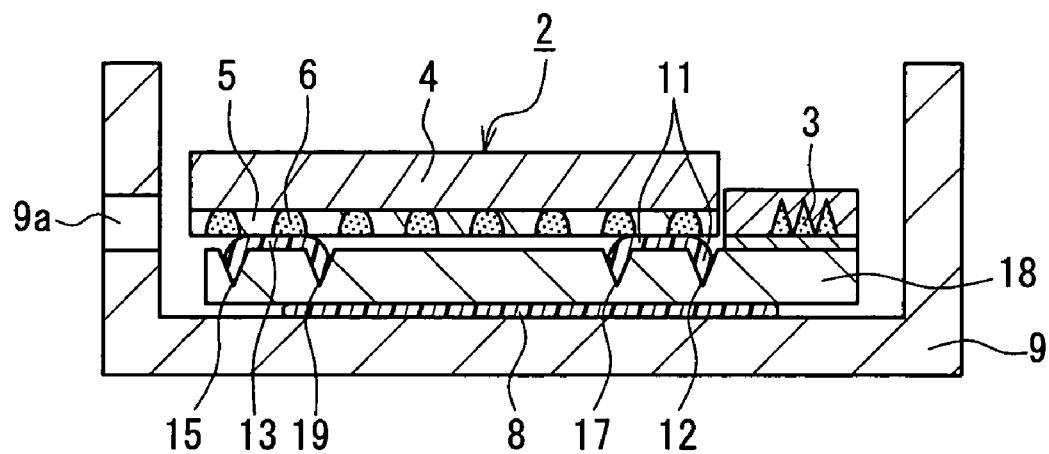
FIG. 10A is a cross-sectional view of a SHG blue laser module of Embodiment 6 of the present invention.
Figure 10B:
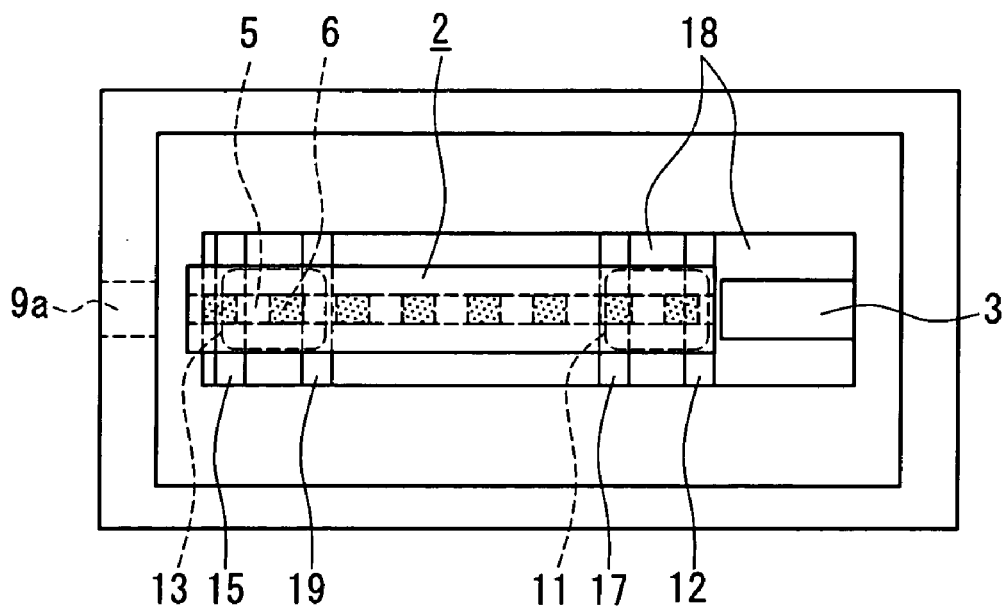
FIG. 10B is a plan view of the same.

A laser module according to Embodiment 6 will be described below, with reference to FIGS. 10A and 10B. This laser module has an improved relative to the configuration with two secured positions shown in FIGS. 6A and 6B. The improved point is that a third groove 17 is formed parallel to the first groove 12 and a fourth groove 19 is formed parallel to the second groove 15 in the Si sub-mount 18. The third groove 17 is similar to that in Embodiment 5. The fourth groove 19 is positioned at a region corresponding to the outgoing end side of the SHG device 2 and between the second groove 15 and the incident end face of the SHG device 2.

Similarly to the third groove 17, the fourth groove 19 is provided for controlling the bonding area. That is, in the present embodiment, the provision of the second groove 15 and the fourth groove 19 allows the bonding area and the shape of the adhesion to be controlled desirably. To this end, a distance L2 between the second groove 15 and the fourth groove 19 is set within a range of 1 mm<L2<L/2, where L denotes the length of the SHG device 2.

As one example according to the present embodiment, the module was manufactured where L1 and L2 were designed as L1=3 mm and L2=2 mm. Thereby, the dimensions of the adhesive layers 11 and 13 on the incident end side and the outgoing end side in the longitudinal direction of the SHG device 2 could be controlled constant. The thus manufactured laser module could have stable dimensions of the adhesive layers and such an adhesive strength. Further, by forming a pair of symmetric grooves, a thickness distribution of the adhesive layers could be made uniform and therefore a more stable adhesive strength could be obtained.

According to the module configuration stated in the present embodiment, an influence of the distortion due to a temperature change can be reduced, and strengths of the adhesives on the incident end side and the outgoing end side can be enhanced more. In order to achieve a sufficient adhesive strength on the outgoing end side of the SHG device 2, L2>1 mm was effective.

EMBODIMENT 7

Figure 11:
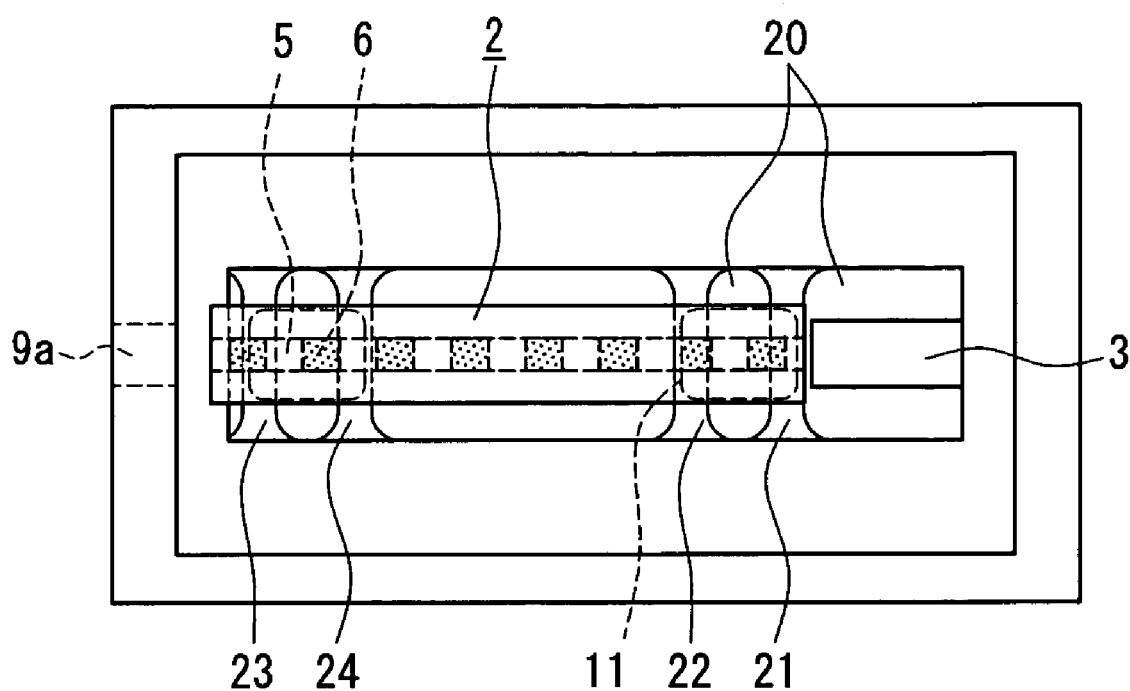
FIG. 11 is a plan view of a SHG blue laser module of Embodiment 7 of the present invention.

A laser module according to Embodiment 7 will be described below, with reference to FIG. 11. This laser module has an improved configuration relative to that shown in FIGS. 10A and 10B. The improved point is that first to fourth grooves 21 to 24, formed in the Si sub-mount 20, have a shape widened at both end portions and not a uniform width.

With this shape of grooves, the both end portions with increased widths function as a reservoir for the adhesive. Therefore, even when an extra amount of the adhesive is applied, this configuration can reduce the chances of the adhesive flowing onto the end face of the semiconductor laser 3.

EMBODIMENT 8

Figure 12A:
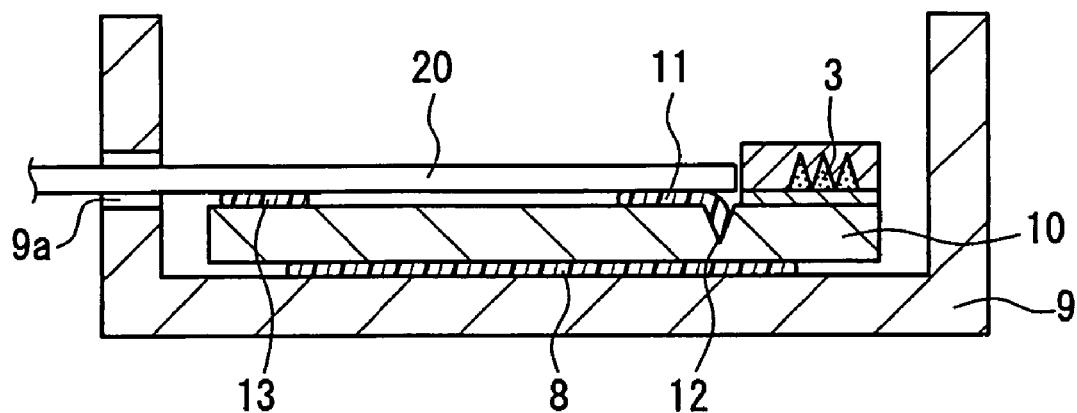
FIG. 12A is a cross-sectional view of a SHG blue laser module of Embodiment 8 of the present invention.
Figure 12B:
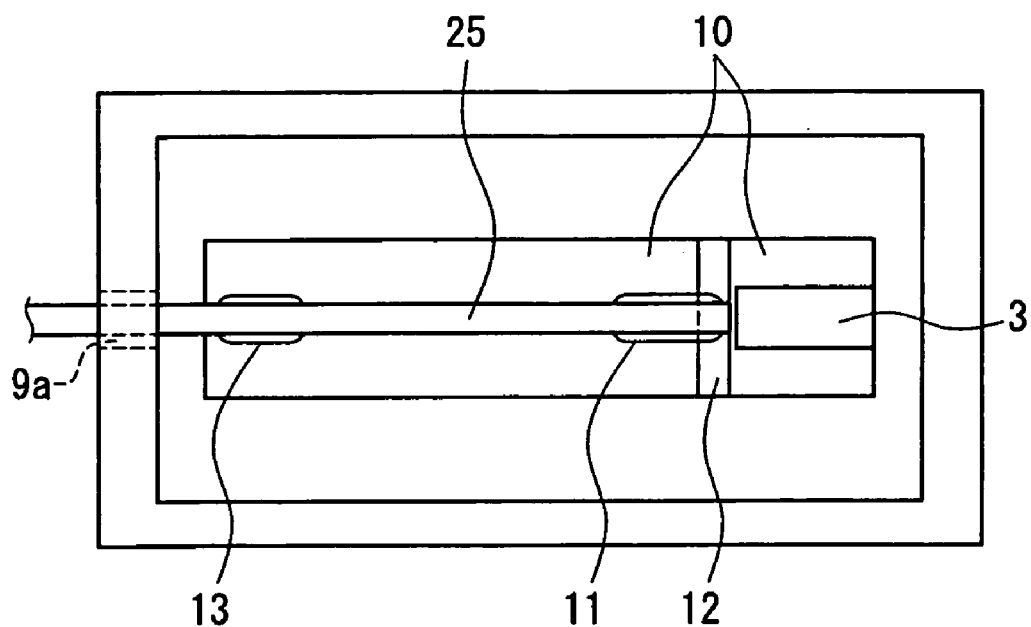
FIG. 12B is a plan view of the same.

A laser module according to Embodiment 8 will be described below, with reference to FIGS. 12A and 12B. This laser module has a configuration where an optical fiber 25 is used as an optical waveguide device in lieu of the SHG devices in the above-stated embodiments. The basic configuration is the same as that shown in FIGS. 4A and 4B, in which the position of the adhesive layer 11 can be controlled by the first groove 12 formed in the sub-mount 10. The adhesive layer 11 allows the incident end face of the optical fiber 25 to be secured to the sub-mount 10 and to be aligned with respect to the outgoing end face of the semiconductor laser 3. The outgoing end side of the optical fiber 25 also is secured to the sub-mount 10 by the adhesive layer 13.

INDUSTRIAL APPLICABILITY

According to the present invention, an adhesive layer for securing an optical waveguide device can be positioned within a preferable area, whereby coupling misalignment resulting from the distortion due to a temperature change can be suppressed. As a result, high reliability of the infrared light coupled output and the blue light output under storage environment and operating environment can be ensured, and a laser module suitable for optical pickups or the like can be manufactured with good yields.

The invention claimed is:

1. A laser module, comprising:
   a sub-mount;
   a semiconductor laser secured to a surface of the sub-mount; and
   an optical waveguide device joined to the surface of the sub-mount by an adhesive layer so that the optical waveguide device is coupled optically with the semiconductor laser,
   wherein a first groove is formed at the surface of the sub-mount at a region corresponding to an incident end side of the optical waveguide device, the first groove being formed parallel to an outgoing end face of the semiconductor laser with a predetermined space therefrom, and wherein a second groove is formed at the surface of the sub-mount at a region corresponding to the incident end side of the optical waveguide device, the second groove being formed parallel to the first groove and being positioned between the first groove and the outgoing end face of the optical waveguide device, wherein a distance L1 between the first groove and the second groove satisfies 1 mm<L1<L/2, where L denotes a length of the optical waveguide device, and the adhesive layer is formed as a single layer provided under the optical waveguide device ranging from a surface of the sub-mount to the inside of the first groove, so that an end portion of the adhesive layer on the incident end side of the optical waveguide device is positioned inside the first groove so as to adhere to a surface of a wall of the first groove under the optical waveguide device and does not contact with the outgoing end face of the semiconductor laser.

2. The laser module according to claim 1, wherein a distance D between the outgoing end face of the semiconductor laser and a proximal end of the adhesive layer satisfies 0 mm<D<0.2 mm.

3. The laser module according to claim 1, wherein the adhesive layer is provided partially at one position close to an incident end face of the optical waveguide device.

4. The laser module according to claim 1, wherein a thickness T1 of the optical waveguide device satisfies T1<1 mm.

5. The laser module according to claim 1, wherein a width W of the optical waveguide device satisfies W<0.85 mm.

6. The laser module according to claim 1, wherein a length L of the optical waveguide device satisfies L>10 mm.

7. The laser module according to claim 1, wherein a thickness T2 of the sub-mount satisfies T2<0.3 mm.

8. The laser module according to claim 1, wherein the optical waveguide device is a quasi-phase-matched second harmonic generation (QPM-SHG) device.

9. The laser module according to claim 1, wherein the optical waveguide device is an optical fiber.

10. A laser module, comprising:
a sub-mount;
a semiconductor laser secured to a surface of the sub-mount; and
an optical waveguide device joined to the surface of the sub-mount by an adhesive layer so that the optical waveguide device is coupled optically with the semiconductor laser, wherein a first groove is formed at the surface of the sub-mount at a region corresponding to an incident end side of the optical waveguide device, the first groove being formed parallel to an outgoing end face of the semiconductor laser with a predetermined space therefrom, and wherein a second groove is formed at the surface of the sub-mount at a region corresponding to an outgoing end side of the optical waveguide device, the second groove being formed parallel to the outgoing end face of the optical waveguide device, and wherein a third groove is formed at the surface of the sub-mount at a region corresponding to the outgoing end side of the optical waveguide device, the third groove being formed parallel to the second groove and being positioned between the second groove and the incident end face of the optical waveguide device, and the adhesive layer is provided partially at least at two positions, close to an incident end face of the optical waveguide device and close to an outgoing end face of the optical waveguide device, the adhesive layer being formed as a single layer provided under the optical waveguide device ranging from a surface of the sub-mount to the inside of the first groove, so that an end portion of the adhesive layer on the incident end side of the optical waveguide device is positioned inside the first groove so as to adhere to a surface of a wall of the first groove under the optical waveguide device and does not contact with the outgoing end face of the semiconductor laser and the adhesive layer close to the outgoing end face is provided along the second groove.

11. The laser module according to claim 10, wherein an area of the adhesive layer close to the incident end face is larger than an area of the adhesive layer close to the outgoing end face.

12. The laser module according to claim 10, wherein a distance L2 between the second groove and the third groove satisfies 1 mm<L2<L/2, where L denotes a length of the optical waveguide device.

* * * * *